United States Patent Office 3,737,339

Patented June 5, 1973

3,737,339

FABRICATION OF PRINTED CIRCUIT BOARDS

Henry Alsberg, Northbrook, and Ronald A. Frederiksen, Schaumburg, Ill., assignors to The Richardson Company, Melrose Park, Ill.

No Drawing. Continuation-in-part of application Ser. No. 812,900, Apr. 2, 1969. This application Dec. 18, 1970, Ser. No. 99,691

Int. Cl. B44d *1/18*

U.S. Cl. 117—212 6 Claims

ABSTRACT OF THE DISCLOSURE

The invention is directed to a printed circuit board comprising a substrate having a hydrocarbon polymer surface where the hydrocarbon polymer is based upon an elastomeric component of a conjugated diene polymer such as a polybutadiene, and a thermosetting component such as a phenolic, and where a metal coating is directly bonded by additive plating, including electroless deposition, to at least a portion of the hydrocarbon polymer. Such circuit boards are characterized by a superior bond between the metal coating and the hydrocarbon polymer and one preparational method involves metalizing the hydrocarbon polymer either in an uncured or partially cured state, and thereafter completing the cure of the hydrocarbon polymer to produce a bond between the polymer and the metal coating of superior strength.

This application is a continuation-in-part application of co-pending application Ser. No. 812,900 filed on Apr. 2, 1969.

This invention relates to printed circuit boards having a substrate with a hydrocarbon polymer surface and a metal coating directly bonded to at least a portion of such hydrocarbon polymer. More particularly, it relates to a printed circuit board where the hydrocarbon polymer is based, in part, upon a conjugated diene polymer; where the metal coating is electrolessly deposited on the hydrocarbon polymer; and where the bond strength or adhesion between the hydrocarbon polymer and metal coating is extremely high.

As known, printed circuit boards have become an important commercial form of circuits for the electronic industry. In general, they comprise a metal coating in a particular design representing a circuit or circuits attached either directly or indirectly, for example, by adhesives, to the surface or surfaces of an electrically nonconductive substrate. Often, the substrate is rigid as in reinforced epoxies, although it can also be flexible as in polyester films. Several important advantages have resulted from the use of printed circuit boards. These include dimensional reproducibility of both the circuit elements and their physical separation which are particularly important with higher frequencies and with miniature circuits. Also, several boards can be combined to form multilayer printed circuit boards in compact form.

While these printed circuit boards have been very useful, they have not been entirely satisfactory. With the use of higher frequencies and miniature circuits, the electrical properties of the substrate are of increased importance to the performance of the circuit. In many applications, such properties as dielectric constant, surface conductivity and dissipation power factor must be fairly low as well as constant over wide temperature changes. However, with multilayer printed circuit boards, an excessive dissipation power factor often causes temperature changes in the confined or buried substrates which results in changes in the circuit characteristics.

In addition, and perhaps of even a more serious nature, the metal coating which forms the circuit on the board frequently separates from the underlying substrate particularly when the metal coating is applied by additive plating techniques. This delamination of the metal coating from the substrate of the board typically occurs during the board manufacture and often during soldering at elevated temperatures. This results either in destruction of the board or undesirable electrical properties for the board. Consequently, this delamination has substantially precluded employment of additive plating techniques in the preparation of printed circuit boards. The development, therefore, of a printed circuit board prepared by additive plating techniques having a substrate with desirable electrical properties and with high resistance to delamination from the added metal coating is particularly desirable.

Briefly, the present invention is directed to an article of manufacture and more particularly to a printed circuit board having a substrate characterized by a surface of a hydrocarbon polymer based, in part, upon a conjugated diene polymer and a metal coating directly bonded by additive plating to at least a portion of the hydrocarbon polymer surface. The resultant printed circuit board commonly exhibits both desirable electrical properties and a high resistance to delamination of the metal coating from the substrate. Generally, these printed circuit boards are produced by first forming on the substrate, a surface layer or coating of an unsaturated hydrocarbon polymer based, in part, upon the conjugated diene polymer followed by etching and sensitizing part or all of the hydrocarbon polymer surface, and finally electrolessly depositing a coating of metal on the sensitized surface. This procedure results in bonding the metal coating directly to the hydrocarbon polymer. Moreover, the bond so produced is highly resistant to delamination or separation of the metal coating from the hydrocarbon polymer, particularly under application of heat such as occurs during soldering and thus allows employment of additive plating techniques for circuit board manufacture.

The printed circuit board of this invention comprises essentially, a substrate characterized by a surface of a hydrocarbon polymer based, in part, upon a conjugated diene polymer and a metal coating directly bonded by additive plating to at least a portion of the hydrocarbon polymer surface. The printed circuit board is in the form commonly utilized in the industry and can have one or more apertures extending part or all of the distance between generally opposite, external surfaces of the substrate. The desired polymeric hydrocarbon is present on at least one of the surfaces of the board substrate and advantageously on all surfaces associated with the formation of circuit elements.

Commonly, the entire substrate is composed of the hydrocarbon polymer and advantageously has reinforcing or core members such as layers of paper, glass fillers of glass or other relatively inert materials contained within the hydrocarbon polymer. While in some instances these reinforcing members are pretreated to improve bonding with the hydrocarbon polymer, as illustrated by the pre-treatment of paper with a phenol-formaldehyde resin, it is preferred according to this invention to incorporate such thermosetting material directly into the hydrocarbon polymer prior to application of the hydrocarbon polymer, preferably as a coating, to the reinforcing core material. Accordingly, as employed herein, the hydrocarbon polymer, forming at least the surface of the substrate, is composed of a thermosetting component in addition to the elastomeric component based upon the conjugated diene polymer. Thus, this hydrocarbon polymer composed of the thermosetting and elastomeric components can be readily applied directly, as a coating, to various reinforcing core materials such as phenol-formaldehyde treated paper, phenolics, epoxies, polyesters, or ceramics to form reinforced substrates particularly suitable for metalizing by additive plating techniques involving initially an electroless metal depositon. Moreover, these reinforced substrates coated with the hydrocarbon polymer ultimately result in the production of printed circuit boards having excellent electrical properties and high resistance to both delamination of the hydrocarbon polymer from the reinforcing core and delamination of the metal coating from the hydrocarbon polymer.

The elastomeric component of the hydrocarbon polymer is essentially composed of a conjugated diene polymer based upon diene monomers having from 4 to 6 carbon atoms such as butadiene or isoprene. Such diene polymers may be employed solely as homopolymers of such diene monomers, for example, as polybutadiene or polyisoprene, or may be employed in combination or polymerized with various other unsaturated polymerizable monomers including, for example, acrylonitrile or styrene or various combinations thereof. Preferably, the elastomeric component is a copolymer or terpolymer of these various polymerizable monomers, and suitable copolymer examples include copolymers of butadiene-acrylonitirle, butadiene-styrene, isoprene-styrene, or isoprene-acrylonitrile, and suitable examples of terpolymers include isoprene-acrylonitrile-styrene or butadiene-acrylonitrile-styrene. Of these various polymers, however, a copolymer, butadiene-acrylonitrile is particularly preferred as the elastomeric component of the hydrocarbon polymer used in the formation of the substrate according to this invention.

The polymers of the above general class which can be utilized according to this invention as the elastomer or elastomeric component of the hydrocarbon polymer, generally include those products available commercially which are claissified as elastomers; which are based upon a diene monomer of from about 4 to about 6 carbon atoms; and which are readily solvent solubilized for coating applications. For example, homopolymers such as polybutadiene can include the commercially available BR synthetic rubbers. Similarly, the polyisoprene can be either a natural or synthetic rubber available under such trade names as NR or IR rubbers. The copolymers employable, such as butadiene-acrylonitrile copolymer, include those copolymers available as NBR rubbers or nitrile rubbers which generally have an acrylonitrile content of from about 18 to 50 weight percent acrylonitrile and are typically prepared by catalytic emulsion polymerization. A particularly preferred butadiene-acrylonitrile copolymer, for example, has an acrylonitrile content of from about 25 to 40 weight percent, a specific gravity of 0.99 and a Mooney plasticity of 68 to 85.

Suitable copolymers of butadiene-styrene for employment as the elastomeric component are available as the SBR, Buna-S or GR-S synthetic rubbers of commerce, which are typically a polymerization product of about 3 parts butadiene and about 1 part styrene. Other copolymers of butadiene-styrene which are also particularly suitable for use as the elastomeric component of the hydrocarbon polymer include both liquid and solid forms of random, graft, or block copolymers, and can include those polymers having polar end groups such as hydroxy terminated or carboxy terminated polymers. The liquid forms of these copolymers are particularly advantageous because when combined with a liquid or solvent solubilized thermosetting component, the resulting liquid hydrocarbon polymer is readily applied to the reinforcing core material utilizing conventional coating techniques. In general, liquid polymers of this type having a number average molecular weight of about 500 to 5,000 and a styrene content of about 0 to 50 mole percent and are characterized by a vinyl or 1,2 unsaturation of about 50 to 90 percent of the total unsaturation. The corresponding solid copolyemrs comprise higher molecular weight products, or partially cross-linked products, or block copolymers as generally illustrated in United States Pat. No. 3,265,765. Still another suitable copolymer of butadiene-styrene is a copolymer which has a vinyl or 1,2 unsaturation below 50 percent. Particular polymers of this class are illustrated in U.S. Pat. No. 3,265,765 as block copolymers of a non-elastomeric polymer block and an elastomeric polymer block, for example, a styrene polymer block and a butadiene polymer block. Advantageously, these polymers are high molecular weight block copolymers with a general formula of A—B, A—B—A, A—B—A—B—A, and the like, wherein "A" is a non-elastomeric polymer having an average molecular weight of 2,000 to 100,000 and a glass transition temperature above about 25° C. The elastomeric polymer block "B" is characterized as having an average molecular weight between about 25,000 to 1,000,000 and a glass transition temperature below about 10 C. Normally, these block copolymers are linear and contain less than about 50 weight percent, but at least above about 10 weight percent of the styrene polymer, and more than 50 weight percent of the butadiene polymer.

The copolymer of butadiene-styrene when used as the elastomeric component of the hydrocarbon polymer may also comprise various blends of different specific butadiene-styrene copolymers. For example, a blend of the above described butadiene-styrene copolymers where one copolymer has a high vinyl or 1,2 olefinic unsaturation above about 50 percent, and the other copolymer below 50 percent, is particularly suitable as the elastomeric component of the hydrocarbon polymer.

When terpolymers are desired as the elastomeric component of the hydrocarbon polymer, they may generally be obtained commercially; for example, a terpolymer of butadiene-acrylonitrile-styrene is readily obtainable as the commercial ABS resins, which normally contain butadiene within the range of from about 5 to 40 weight percent; acrylonitrile within the range of from about 5 to 30 weight percent. While not technically a terpolymer, physical admixtures of butadiene-acrylonitrile-styrene may also be employed, for example, an admixture of a copolymer of butadiene-styrene resin and a copolymer of butadiene-acrylonitrile. The terpolymers of isoprene, acrylonitrile and styrene are also available commercially, and typically comprise a terpolymer containing isoprene within the range from about 5 to 40 weight percent; acrylonitrile within the range of from about 5 to 30 weight percent; and styrene within the range of from about 30 to 90 weight percent.

The thermoset or thermosetting component employed together with the elastomer or elastomeric component to form the hydrocarbon polymer can generally include any of those resinous materials conventionally employed for electrical application which form infusible, thermoset resins under appropriate curing conditions and which are compatible with the elastomeric component. Suitable thermosets include the aminoplasts, for example, the thermosetting resins prepared by the polycondensation of formaldehyde with an aliphatic alcohol, for example, butanol, and a nitrogen compound such as urea or a triazine such as melamine. Other thermosetting resins which may also be successfully employed include epoxy resins or phenolic resins prepared by the conventional reaction of phenols with aldehydes such as formaldehyde, acetaldehyde, or furfuryl alcohol, which are heat curable to an infusible thermoset. Of the various thermosets which may be employed as the thermosetting component, however, the phenolics are particularly preferred, and especially the phenol-formaldehyde reaction products. A typical example of a preferred phenol-formaledhyde resin, comprises the reaction product of about 1 mol of phenol and from about 1.0 to about 1.5 mols of formaldehyde with a more limited range of from about 1.2 to about 1.3 mols of formaldehyde generally being preferred.

In preparing the hydrocarbon polymer according to this invention for application, particularly as a coating to the reinforcing core material of the substrate, for example, a phenolic treated paper laminate, the elastomeric component and the thermosetting component can be admixed in widely varied proportions. The particular proportion chosen in any instance will be a function of the specific elastomer and thermoset employed, as well as the particular electrical or physical properties ultimately desired for the printed circuit board. Typical, however, the proportion of the elastomer to the thermoset in the hydrocarbon polymer can range from about 15 weight parts of elastomer to 1 weight part thermoset, to 1 weight part elastomer to 2 weight parts of thermoset. Generally, however, a more limited proportion is usually preferred, particularly to maximize the bonding of the hydrocarbon polymer to the reinforcing core and especially to achieve greater adhesion of the metal coating to the hydrocarbon polymer. For example, when preparing a particularly desirable hydrocarbon polymer according to this invention where the elastomeric component comprises a butadiene-acrylonitrile copolymer and the thermoset component comprises a phenolic resin of phenol-formaldehyde, the proportion of the elastomer to the thermoset is preferably maintained within the range of from about 1 to 10 weight parts elastomer to about 1 weight part thermoset with a range of from about 6 to 9 weight parts elastomer per 1 weight part of the thermoset being especially preferred particularly to maximize bonding of the metal coating to the hydrocarbon polymer.

The hydrocarbon polymer can contain other materials in addition to the elastomeric and thermosetting components and such materials typically include curing agents, rubber accelerators, anti-tack and components and cross-linking agents. The curing agents and rubber accelerators are employed to cure the elastomeric or thermosetting components to a more rigid state. However, because the thermosetting component employed according to this invention is generally heat curable, such curing or accelerating agents are typically used solely for the elastomeric component. The particular curing or accelerating agent employed can be widely varied and most of the curing and accelerating agents conventionally employed for the curing of rubber elastomers may be suitably utilized. Generally, the particular curing agent selected will depend upon the elastomeric component employed and the temperature range or series of temperature ranges selected to effect the cure. Suitable curing agents include organic peroxides such as those listed in Kirk-Othmer, Encyclopedia of Chemical Technology, vol. 14, and particularly those with activation temperatures or 30 to 50° C. or sulfur containing vulcanizers which are commonly employed to harden natural or synthetic elastomers. Irradiation techniques conventionally employed to initiate free radical formations may also be employed alone or in combination with curing agents to effect the desired curing. The quantity of curing agent or accelerator employed in the hydrocarbon polymer may vary but typically those quantities conventionally employed in the curing of rubbery elastomers may be satisfactorily used. For example, when utilizing curing agents such as sulfur-containing vulcanizers such as tetramethylthiuram disulfide or 4-4′-dithiodimorpholine, suitable amounts range from about 1 to 10 weight parts of vulcanizer per hundred weight parts of elastomer.

The cross-linking agents which may be suitably added to the hydrocarbon polymers to increase the thermoset characteristics can include those monomers conventionally employed as cross-linking multifunctional monomers. For example, polyfunctional isocyanates illustrated by the addition product formed from the reaction of toluene diisocyanate and trimethylolpropane may suitably be employed. The anti-tack components are added to provide easier mechanical handling of the elastomer during preparation of the hydrocarbon polymer and especially to provide anti-blocking properties to the hydrocarbon polymer prior and subsequent to metallization. Particularly suitable anti-tack components include mica, soapstone, alkaline-earth silicates such as magnesium silicate and talc.

In preparing the circuit board according to this invention, several different preparational procedures may be employed. For example, where the hydrocarbon polymer is employed solely as the substrate without any reinforcing core material, the hydrocarbon polymer may simply be cured or partially cured to a relatively rigid state and thereafter metalized to add the desired metal coating. However, when the preferred boards are prepared with a substrate comprising a reinforcing core coated with the hydrocarbon polymer, the basic procedure involves applying the hydrocarbon polymer as a coating to the core material, curing or partially curing the hydrocarbon polymer, metalizing such polymer and thereafter completing, if necessary, the curing of the hydrocarbon polymer so as to effectively bond the metal coating to the hydrocarbon polymer as well as to effectively bond the reinforcing core material to the hydrocarbon polymer.

In preparing the hydrocarbon polymer for application as a coating, the selected elastomeric component and thermosetting component may simply be physically admixed and then applied to the reinforcing core materials utilizing conventional coating techniques. Such reinforcing core materials can include any of the material conventionally employed in printed circuit boards, including, for example, phenolic resins, epoxies, and polyesters which may contain further reinforcing materials such as glass in fiber or mat form, cotton, asbestos, or cellulose, for example, a laminate of phenolic treated paper. Preferably, the hydrocarbon polymer is applied to the reinforcing core as a coating in liquid form for ease of application. Generally, dependent upon the particular elastomer and thermoset components employed as well as the particular reinforcing core material utilized, the thermosetting and elastomeric components within the hydrocarbon polymer can be solubilized in various aqueous or organic solvents either before or after admixing. Such organic solvents can include, for example, ketones, aldehydes, or esters which have volatilities suitable for coating at relatively low temperatures. The particular solvent system employed for the hydrocarbon polymer can vary, but generally a combination of different solvents are selected so as to provide suitable dissolving or suspending of the elastomer and thermosetting component; a desirable drying time during the coating of the reinforcing core; and a solubilizing attack or dissolving of the reinforcing core material to provide physical anchoring of the hydrocarbon polymer to the core material. For example, when employing a hydrocarbon polymer formed from an elastomer such as a butadiene-acrylonitrile copolymer and a thermoset such as a phenol-formaldehyde resin, a suitable solvent system comprises an admixture of an alkanol such as methanol, ketones such as methyl-isobutyl ketone and methyl-ethyl ketone, and an ester such as n-butyl acetate.

With the hydrocarbon polymer solubilized in liquid form, it can be readily applied to the reinforcing core material utilizing such conventional coating techniques as roller, doctor blade, or curtain coating. Thereafter, the polymer is dried to remove the volatile solvents, leaving the hydrocarbon polymer on the core ready for curing and metalizing by additive plating. The hydrocarbon polymer coating so applied to the cured material can vary in thickness with the particular thickness or amount of polymer in any instance being dependent upon such variables as the particular hydrocarbon polymer employed, the reinforcing core material utilized as well as the physical or electrical properties ultimately desired for the final circuit board. Usually, however, when employing a hydrocarbon polymer of a butadiene-acrylonitrile copolymer as the elastomeric component and a phenol-formaldehyde resin as the thermosetting component, the hydrocarbon polymer is applied to the reinforcing core in an amount sufficient to produce a coating after solvent removal and after either full or partial curing, having a dry thickness ranging from about 0.1 to 2.5 mils with from 1.10 to 1.75 mils usually being preferred in most instances.

After the hydrocarbon polymer is applied to the reinforcing core and dried to remove the solvents, the polymer is cured prior to metalization. This curing can be conducted so as to completely cure the hydrocarbon polymer prior to the metalization or conducted so as to effect only a partial cure prior to metalization with the remaining cure being completed subsequent to the metalization. Generally, the preferred procedure, particularly to maximize bonding between the metal coating and hydrocarbon polymer, involves conducting the cure in at least two steps with a partial cure being effected before metalization and the cure being completed subsequent to metalization or partial metalization. The particular temperature range selected to effect the cure will vary depending upon the particular hydrocarbon polymer and especially the elastomeric component employed, the number of heat curing steps, and the particular curing agent, if any, employed within the hydrocarbon polymer. Usually, however, a temperature ranging from about 80° C. to about 190° C. may be employed for any heat curing step with a more limited range of from about 100° C. to 160° C. generally being preferred. The duration of the cure is a function of the particular hydrocarbon polymer, its thickness, the number of curing steps employed, and the particular curing temperature. Typically, however, when the curing is effected in one or two heating steps with temperatures ranging from about 100° C. to 160° C., the total length of the cure both before and after metalizing may range from 0.5 to 3 hours.

After the hydrocarbon polymer is cured or partially cured, the metal coating is applied by metalizing the substrate utilizing additive plating techniques. Basically, this involves first etching and sensitizing the hydrocarbon polymer surface, electrolessly depositing the metal coating followed, if desired, by electrolytic deposition of additional metal. Advantageously, the etching is carried out with strong acids such as sulfuric or phosphoric with substances such as sodium dichromate. The severity of the etch is somewhat dependent on the extent of cure of the hydrocarbon polymeric surface of the substrate. The sensitizing step is carried out according to conventional practice with reducing agents such as stannous chloride followed by palladium chloride or other catalyst. It is understood that partial masking of the hydrocarbon polymer surface can be carried out before the etching or sensitizing step to limit the modification of the polymer surface where only insulating and not circuit properties are required.

A metal coating is then applied to the sensitized surface by electroless deposition techniques. This usually results in a thin coating with a thickness and continuity sufficient to conduct electricity with the thickness ranging up to about 1 mil which minimizes subsequent metal removal during the formation of circuit elements. The metal applied in the electroless deposition is conventionally and conveniently nickel, copper, cobalt, gold or various alloys thereof, or other metal selected both for ease of application and performance in the final circuit board. Usually, the metal is a transition metal with an atomic number of about 21 to 79 such as nickel, copper, gold, silver, cobalt, and the like. Preferably, the metal is nickel or copper.

When the metal coating is applied by electroless deposition over the entire hydrocarbon surface, the metal coating layer thereafter may be partially masked and the remaining areas electroplated to provide a final additional metal layer for circuit purposes. The metal selected for this additional metal layer may also be any of the above group of transition metals and preferably is copper, silver, or gold. The mask and the portions of the electroless metal layer underlying the mask is then removed by known chemical etching techniques leaving the metal coating on the hydrocarbon surface of the board in the desired circuit configuration.

The following examples illustrate some of the embodiments of this invention. It is to be understood that these are for illustrative purposes only and do not purport to be wholly definitive to conditions or scope.

EXAMPLE I

A hydrocarbon substrate was prepared by coating an etched, thermoset-hydrocarbon laminate with a toluene solution containing about 5 weight percent of a styrene-butadiene block copolymer based on approximately 23–25 weight percent styrene. The solution also contained approximately 6 p.p.h. of benzoyl peroxide to provide later cure.

The coated product was baked at about 100° C. for approximately 48 minutes to provide solvent removal and partial cure of the hydrocarbon coating. The board was then treated with an etchant composed of about 69 weight percent of 96% sulfuric acid, 25 weight percent of 85% phosphoric acid, 2 weight percent of sodium dichromate (dihydrate) and about 5.0 weight percent water. Treatment was carried out at about 55° C. for about 1–2 minutes. After being rinsed, the board was treated with a solution of 10 weight percent of stannous chloride, rinsed with water, and immersed in a HCl solution of palladium chloride (about 1 g./l.).

A thin nickel coating was applied to the rinsed, sensitized surface using a nickel chloride solution with a hypophosphite reducing agent. The thickness was sufficient to render the surface conductive to an electrical current.

Subsequently, copper was electroplated to a thickness of approximately 1 ml. The resultant metal coating plate was then heated at approximately 100° C. for about 48 minutes to remove water and complete the curing cycle.

A 90° peel strength test was carried out on a sample of the metal coated, thermoset board using a peel rate of about 2 inches per minute on one inch (width) samples. Values of 5–6 lbs. per inch were obtained.

EXAMPLE II

Additional samples of a metal coated board were prepared using the techniques of Example I. The coating solutions contained from 2½ to 10 weight percent of the butadiene-styrene polymer in toluene with the curing agent being in a concentration of about 6 p.p.h. Samples of the dip coated laminate after being coated with electroless metal were then plated with copper to varying thicknesses. The resultant samples were then subjected to dip-solder resistance tests at 500° F. in which the sample was immersed in solder and the degree of blistering and destruction of the metal bond to the hydrocarbon surface was determined. In the test, it was found that samples prepared from polymer concentrations of 2½ to 5 weight percent produced products which passed the dip-solder test for at least 60 seconds. In these tests, the thickness of copper plate on the various samples that passed the 60 second dip-solder test, ranged from 0.056 mils to 0.15 mils.

EXAMPLE III

A hydrocarbon laminate was fabricated from layers of phenol-formaldehyde treated paper which had been saturated with a graft copolymer of polybutadiene and styrene. The copolymer was based on a butadiene content of approximately 60 mole percent (a 1.2 unsaturation in the polybutadiene of about 60–70 percent, and contained an organic peroxy catalyst. Fabrication of the laminate was carried out with curing of the polymeric hydrocarbon to provide a thermoset laminate.

The laminate was cleaned with an alkaline solution and then treated with an etchant solution containing about 24 weight percent of 96% sulfuric acid, 68 weight percent of 85% phosphoric acid, 4 weight percent of sodium dichromate (dihydrate) and 4 weight percent of water. Treatment was carried out at about 175° F. with vigorous agitation for about 15–20 minutes. The board was then rinsed, immersed in a 5% NaOH solution at about 110° F. for a few minutes, rinsed again, and then sensitized in the manner described in Example I.

After being sensitized, the board was rinsed and coated with a thin layer of nickel applied from the solution described in Example I. An electroplated coating of copper was then applied and the resultant board was baked at about 200° F. for 48 minutes.

A 90° peel test was carried out on a sample of the board. Values of 3–4 lbs. per inch were obtained as measured at the rate of 2 inches per minute.

EXAMPLE IV

A circuit board was prepared utilizing a hydrocarbon polymer with an elastomer component and a thermoset component according to the following procedure. The hydrocarbon polymer was prepared by dissolving 96.25 weight parts of NBR ruber containing about 8.75 weight parts talc and about 87.5 weight parts of a butadiene-acrylonitrile copolymer having an acrylonitrile content of about 25 to 40 weight percent, a specific gravity of 0.99 and a Mooney plasticity of from 68 to 85 in about 725 weight parts of methyl ethyl ketone with agitation. To the resultant solution were added with mixing about 12.5 weight parts of a phenolic resin comprising the reaction product of 1 mol phenol and from about 1.2 to 1.3 mols formaldehyde dissolved in 8.5 weight parts methyl ethyl ketone. The solubilized hydrocarbon polymer was transferred to a dip tank and a phenolic treated paper laminate (5 inches square and ¼ inch thick) was coated on both sides by immersion into the hydrocarbon polymer solution for a period of about 10 minutes. The coated laminate was thereafter dried at 110° C. for about 30 minutes to remove solvent. The hydrocarbon polymer coating was then cured by heating the coated laminate first at 110° C. for 10 minutes, then from 110° C. to 150° C. for 30 minutes and finally at 150° C. for 30 minutes. The cured hydrocarbon polymer coating had a thickness of approrimately 1.5 mils.

The resultant substrate comprising the cured hydrocarbon polymer coated over the reinforcing core of the phenolic treated laminate was then metalized according to the following procedure. After detergent washing, the substrate was etched by treatment with an aqueous chromic solution for about 5 minutes at about 25° C. After removing from the etching solution and water rinsing, the substrate was contacted with a 5 percent sodium hydroxide solution and then water rinsed. Thereafter, the substrate polymer surface was sensitized by treatment with aqueous stannous chloride solution (10 weight percent stannous chloride) followed by water washing after which the polymer surface was treated with an aqueous hydrochloric acid, palladium chloride solution (about 1 gram PdCl per liter). A nickel coating was then applied to the sensitized hydrocarbon polymer surface of the substrate by treatment with a nickel chloride solution in the presence of a reducing agent. The nickel coating so deposited was sufficient to render the surface electrically conductive. Thereafter, a copper coating of approximately 1 mil thickness was electroplated onto the nickel coating and the resultant copper coated substrate was cleaned and dried to obtain the desired circuit board of a metal coated substrate. In the board so produced, the circuit is represented by the metal coating. If the circuit is to be of a particular design, then conventional masking procedures as previously discussed may be employed to produce the desired design.

The strength or adhesion of the copper metal coating bonded to the hydrocarbon polymer was evaluated by conducting a 90° peel strength test on the board according to the following procedure: A strip of approximately ½ inch width and approximately 4 inches long was cut on the surface of the substrate, and a tab formed at one end of the strip by separating the metal coating from the hydrocarbon polymer. While maintaining the substrate at 25° C., the tab was then pulled vertically upward at an angle of 90° at a rate of 2 inches per minute and the force required to separate the metal coating from the hydrocarbon polymer was measured as the 90° peel strength. A peel strength of approximately 20 lbs. per inch width of the strip was obtained for the substrate prepared according to the procedures of this example.

EXAMPLE V

A circuit board was prepared utilizing a hydrocarbon polymer with an elastomer component and a thermoset component according to the following procedure. The hydrocarbon polymer was prepared by dissolving 96.25 weight parts of NBR rubber containing 8.75 weight parts talc and 87.5 weight parts of the butadiene-acrylonitrile copolymer as described in Example IV in about 350 parts by weight of methyl ehtyl ketone with agitation. To the resultant solution were added with mixing about 22.8 weight parts of the phenolic resin described in Example IV dissolved in methanol (55 percent solids). About 1.28 weight parts of tetramethylthiuram disulfide and 1.28 weight parts of 4,4′ dithiodimorpholine were mixed with 31 weight parts of methyl isobutyl ketone and 103 weight parts of n-butyl acetate and the resulting mixture added to the solubilized hydrocarbon polymer. A glass-reinforced epoxy resin panel (5 inches square and ¼ inch thick) was coated on both sides with the hydrocarbon polymer by roller coating. The coated laminate was thereafter dried at 25° C. for about 60 minutes to remove solvent. The hydrocarbon polymer coating was then partially cured by heating the coated laminate at 150° C. for 60 minutes to form a polymer coating having a thickness of about 1.5 mils.

The resultant substrate comprising the partially cured hydrocarbon polymer coated over the reinforcing core of the glass reinforced epoxy resin panel was then metalized according to the procedure of Example IV to ultimately produce a copper coating about 0.1 mil. thickness. The copper electroplating was then stopped and the copper plated substrate was heated at 150° C. for 60 minutes to complete curing of the hydrocarbon polymer. Thereafter, the electroplating was continued to increase the copper coating to about 1 mil. thickness to form the desired circuit board of a metal coated substrate. In the board so produced, the circuit is represented by the metal coating. If the circuit is to be of a particular design, then conventional masking procedures as previously discussed may be employed to produce the desired design.

The 90° peel strength of the circuit board was evaluated according to the procedure of Example IV to give a value of about 20 pounds per inch. The circuit board was also evaluated for dip solder resistance according to the procedure of Example II and results in excess of 20 seconds were obtained.

EXAMPLE VI

A circuit board was prepared utilizing a hydrocarbon polymer with an elastomer component and a thermoset component according to the following procedure. The hydrocarbon polymer was prepared by dissolving 82.5 weight parts of NBR rubber containing 7.5 weight parts talc and 75 weight parts of the butadiene-acrylonitrile copolymer described in Example IV in about 323 weight parts of methyl ethyl ketone with agitation. To the resultant solution were added with mixing about 455 weight parts of the phenolic resin described in Example IV dissolved in methanol (55 percent solids). About 1.1 weight parts of tetramethylthiuram disulfide and 1.1 weight parts of 4,4′-dithiodimorpholine were mixed with 265 weight parts of methyl isobutyl ketone and 88 weight parts of n-butyl acetate and the resulting mixture added to the solubilized hydrocarbon polymer. A glass-reinforced epoxy resin panel (5 inches square and ¼ inch thick) was coated on both sides with the hydrocarbon polymer by roller coating. The coated laminate was thereafter dried at 25° C. for about 60 minutes to remove solvent to form a polymer coating thickness of about 1.5 mils. The hydrocarbon polymer coating was then partially cured by heating the coated laminate at 150° C. for 60 minutes.

The resultant substrate comprising the partially cured hydrocarbon polymer coated over the reinforcing core of the glass reinforced epoxy resin panel was then metalized according to the procedure of Example IV to ultimately produce a copper coating about 0.1 mil thickness. The copper electroplating was then stopped and the copper plated substrate was heated at 150° C. for 60 minutes to complete curing of the hydrocarbon polymer. Thereafter, the electroplating was continued to increase the copper coating to about 1 mil thickness to form the desired circuit board of a metal coated substrate. In the board so produced, the circuit is represented by the metal coating. If the circuit is to be of a particular design, then conventional masking procedures as previously discussed may be employed to produce the desired design.

The 90° peel strength of the circuit board was evaluated according to the procedure of Example IV to give a value of from 10 to 18 pounds per inch. The circuit board was also evaluated for dip solder resistance according to the procedure of Example II and results in excess of 20 seconds were obtained.

EXAMPLE VII

A circuit board was prepared utilizing a hydrocarbon polymer of an elastomer component and a thermoset component according to the following procedure. The hydrocarbon polymer was prepared by dissolving 96.25 weight parts of NBR rubber containing 8.75 weight parts talc and 87.5 weight parts of the butadiene-acrylonitrile copolymer described in Example IV in about 350 parts by weight of methyl ethyl ketone, 31 weight parts of methyl isobutyl ketone and 103 parts of n-butyl acetate with agitation. To the resultant solution were added with mixing about 22.8 weight parts of the phenolic resin described in Example IV dissolved in methanol (55 percent solids) and then about 1.28 weight parts of tetramethylthiuram disulfide and 1.28 weight parts of 4,4′-dithiodimorpholine were added to the solubilized hydrocarbon polymer. A glass-reinforced epoxy resin laminate (5 inches square and ¼ inch thick) was coated on both sides with the hydrocarbon polymer by roller coating. The coated laminate was thereafter dried at 25° C. for about 120 minutes to remove solvent to form a polymer coating thickness of about 1.5 mils. The hydrocarbon polymer coating was then partially cured by heating the coated laminate at 150° C. for about 60 minutes.

The resultant substrate comprising the partially cured hydrocarbon polymer coated over the reinforcing core of the glass reinforced epoxy resin panel was then metalized according to the procedure of Example IV to ultimately produce a copper coating about 0.1 mil thickness. The copper electroplating was then stopped and the copper plated substrate was heated to complete curing of the hydrocarbon polymer at 107° C. for 35 minutes, 107° to 121° C. for 15 minutes, 121° C. for 45 minutes, 121° C. to 135° C. for 20 minutes and 135° C. for 60 minutes. Thereafter, the electroplating was continued to increase the copper coating to about 1 mil thickness to form the desired circuit board of a metal coated substrate. In the board so produced, the circuit is represented by the metal coating. If the circuit is to be of a particular design, then conventional masking procedures as previously discussed may be employed to produce the desired design.

The 90° peel strength of the circuit board was evaluated according to the procedure of Example IV to give a value of about 20 pounds per inch. The circuit board was also evaluated for dip solder resistance according to the procedure of Example II and results in excess of 20 seconds were obtained.

EXAMPLE VIII

A circuit board was prepared utilizing a hydrocarbon polymer of an elastomer component and a thermoset component according to the following procedure. The hydrocarbon polymer was prepared by dissolving 55 weight parts of NBR rubber containing 5 weight talc and 50 weight parts of the butadiene-acrylonitrile copolymer described in Example IV in about 270 parts by weight of methyl ethyl ketone with agitation. To the resultant solution were added with mixing about 91 weight parts of the phenolic resin described in Example IV dissolved in methanol (55 percent solids). About 0.73 weight parts of tetramethylthiuram disulfide and 0.73 weight parts of 4,4′-dithiodimorpholine were mixed with 18 weight parts of methyl isobutyl ketone and 59 weight parts of n-butyl acetate and the resulting mixture added to the solubilized hydrocarbon polymer. A glass-reinforced epoxy resin panel (5 inches square and ¼ inch thick) was coated on both sides with the hydrocarbon polymer by roller coating. The coated laminate was thereafter dried at 25° C. for about 60 minutes to remove solvent to form a polymer coating thickness of about 1.5 mils. The hydrocarbon polymer coating was then partially cured by heating the coated laminate at 150° C. for 60 minutes.

The resultant substrate comprisnig the partially cured hydrocarbon polymer coated over the reinforcing core of the glass reinforced epoxy resin laminate was then metalized according to the procedure of Example IV to ultimately produce a copper coating of about 0.1 mil thickness. The copper electroplating was then stopped and the copper plated substrate was heated at 150° C. for 60 minutes to complete curing of the hydrocarbon polymer. Thereafter, the electroplating was continued to increase the copper coating to about 1 mil thickness to form the desired circuit board of a metal coated substrate. In the board so produced, the circuit is represented by the metal coating. If the circuit is to be of a particular design, then conventional masking procedures as previously discussed may be employed to produce the desired design.

The 90° peel strength of the circuit board was evaluated according to the procedure of Example IV to give a value of about 12 to 18 pounds per inch. The circuit board was also evaluated for dip solder resistance according to the procedure of Example II and results in excess of 10 to 20 seconds were obtained.

EXAMPLE IX

A circuit board was prepared utilizing a hydrocarbon polymer of an elastomer component and a thermoset component according to the following procedure. The hydrocarbon polymer was prepared by dissolving 96.25 weight parts of NBR rubber containing 8.75 weight parts talc and 87.5 weight parts of the butadiene-acrylonitrile copolymer described in Example IV in about 350 parts by weight of methyl ethyl ketone with agitation. To the resultant solution were added with mixing about 22.8 weight parts of the phenolic resin described in Example IV dissolved in methanol (55 percent solids). About 1.28 weight parts of tetramethylthiuram disulfide and 1.28 weight parts of 4,4′-dithiodimorpholine were mixed with 31 weight parts of methyl isobutyl ketone and 103 weight parts of n-butyl acetate and the resulting mixture added to the solubilized hydrocarbon polymer. A phenolic treated paper laminate (5 inches square and ¼ inch thick) was coated on both sides with the hydrocarbon polymer by roller coating. The coated laminate was thereafter dried to remove solvent to form a polymer coating thickness of about 1.25 mils. The hydrocarbon polymer coating was then partially cured by heating the coated laminate at 150° C. for 60 minutes.

The resultant substrate comprising the partially cured hydrocarbon polymer coated over the reinforcing core of the phenolic treated paper laminate was then metalized according to the procedure of Example IV to ultimately produce a copper coating about 0.1 mil. thickness. The copper electroplating was then stopped and the copper plated substrate was heated at 150° C. for 60 minutes to complete curing of the hydrocarbon polymer. Thereafter, the electroplating was continued to increase the copper coating to about 1 mil. thickness to form the desired circuit board of a metal coated substrate. In the board so produced, the circuit is represented by the metal coating. If the circuit is to be of a particular design, then conventional masking procedures as previously discused may be employed to produce the desired design.

The 90° peel strength of the circuit board was evaluated according to the procedure of Example IV to give a value of from 14 to 17 pounds per inch. The circuit board was also evaluated for dip solder resistance according to the procedure of Example II and results in excess of 20 seconds were obtained.

We claim:

1. A printed circuit board comprising a hydrocarbon substrate of a butadiene-acrylonitrile copolymer and a phenol-formaldehyde resin where the copolymer and resin are present in a ratio of from about 6:1 to about 9:1 parts by weight, respectively, and where the phenol-formaldehyde resin contains formaldehyde and phenol in a mol ratio of from about 1:1 to about 1.5:1, respectively, and an electroless metal deposit bonded to at least a portion of the substrate.

2. The circuit board of claim 1 wherein the butadiene-acrylonitrile copolymer contains from about 18 to 50 weight percent of acrylonitrile.

3. The circuit board of claim 2 wherein the phenol-formaldehyde resin contains formaldehyde and phenol in a mol ratio of from about 1.2:1 to about 1.3:1, respectively.

4. The circuit board of claim 2 wherein the substrate contains a reinforcing core which is coated with the substrate.

5. A method of preparing, by electroless plating, a printed circuit board having high adhesion between the deposited metal coating and the insulating substrate which comprises the steps of (1) coating a reinforcing core with a hydrocarbon substrate of a butadiene-acrylonitrile copolymer and a phenol formaldehyde resin where the copolymer and resin are present in a ratio of from about 6:1 to about 9:1 parts by weight respectively, (2) at least partially curing the hydrocarbon substrate, and (3) metalizing by electroless plating, the partially cured substrate to add the metal coating said metalizing comprising the steps of (1) etching, (2) sensitizing, and (3) electrolessly depositing an electrically conductive metal layer on the sensitized, hydrocarbon substrate and thereafter electroplating to completely form the desired metal coating whereby the circuit board thus prepared has the reinforcing core coated with the substrate and the metal coating is bonded to at least a portion of the surface of the substrate and where the hydrocarbon substrate is cured in two steps which comprises partially curing the hydrocarbon substrate prior to etching and completing the curing subsequent to the addition of the metal coating by electroplating with both the partial and complete curing being effected by heating at a temperature of from about 80° to about 160° C.

6. The method of claim 5 wherein the hydrocarbon substrate is cured in two steps which comprises partially curing the hydrocarbon substrate prior to etching and completing the curing subsequent to the addition of the metal coating by electroplating with both the partial and complete curing being effected by heating at a temperature of from about 100° to about 160° C.

References Cited

UNITED STATES PATENTS

| | | | |
|---|---|---|---|
| 3,240,662 | 3/1966 | Smyers et al. | 161—225 |
| 3,226,256 | 12/1965 | Schneble et al. | 117—218 X |
| 3,293,109 | 12/1966 | Luce et al. | 156—150 X |
| 3,317,315 | 5/1967 | Nicoll et al. | 117—218 X |
| 3,445,350 | 5/1969 | Klinger et al. | 204—30 |
| 3,305,460 | 2/1967 | Lacy | 204—20 |
| 2,876,530 | 3/1959 | Howatt | 29—155.5 |
| 3,547,785 | 12/1970 | Sakuma | 204—30 |
| 3,567,594 | 3/1971 | Wells | 204—20 |
| 3,333,024 | 7/1967 | Haefele et al. | 260—880 |
| 3,267,007 | 8/1966 | Sloan | 204—15 |

MURRAY KATZ, Primary Examiner

M. R. LUSIGNAN, Assistant Examiner

U.S. Cl. X.R.

117—213, 217, 218; 204—15, 30, 38 B